United States Patent [19]

Fiori, Jr.

[11] Patent Number: 4,816,704
[45] Date of Patent: Mar. 28, 1989

[54] FREQUENCY-TO-VOLTAGE CONVERTER

[76] Inventor: David Fiori, Jr., 140 Dollington Rd., Yardley, Pa. 19067

[21] Appl. No.: 40,878

[22] Filed: Apr. 21, 1987

[51] Int. Cl.[4] .................. H03K 5/19; G01R 23/06
[52] U.S. Cl. .................................. 307/519; 307/529; 328/133; 328/140
[58] Field of Search ............... 307/519, 529; 328/133, 328/140

[56] References Cited

U.S. PATENT DOCUMENTS 3,944,935  3/1976  Plant ................................. 307/519

Primary Examiner—John S. Heyman
Assistant Examiner—Margaret R. Wambach
Attorney, Agent, or Firm—Ratner & Prestia

[57] ABSTRACT

A frequency-to-voltage converter which responds either to frequency variations or to time period variations of a varying frequency input signal. When arranged to respond to frequency variations, the input signal is mixed with two fixed frequency framing signals having known frequency relationships to the frequency of a fixed frequency reference signal. One framing signal has a frequency greater than the maximum frequency of the input signal and the other framing signal has a frequency less than the minimum frequency of the input signal. By mixing the input signal with the framing signals and then measuring the relative times required to count a prescribed number of cycles of each of the difference signals produced by the mixing, an indication of changes in the input signal frequency relative to the reference signal frequency is developed. When arranged to respond to time period variations, the reference signal is mixed with two variable frequency framing signals having known frequency relationships to the range of frequency variations of the input signal. One framing signal has a frequency range greater than the reference signal frequency and the other framing signal has a frequency range less than the reference signal frequency. By mixing the reference signal with the framing signals and then measuring the relative times required to count a prescribed number of cycles of each of the difference signals produced by the mixing, an indication of changes in the input signal frequency relative to the reference signal frequency is developed.

37 Claims, 3 Drawing Sheets

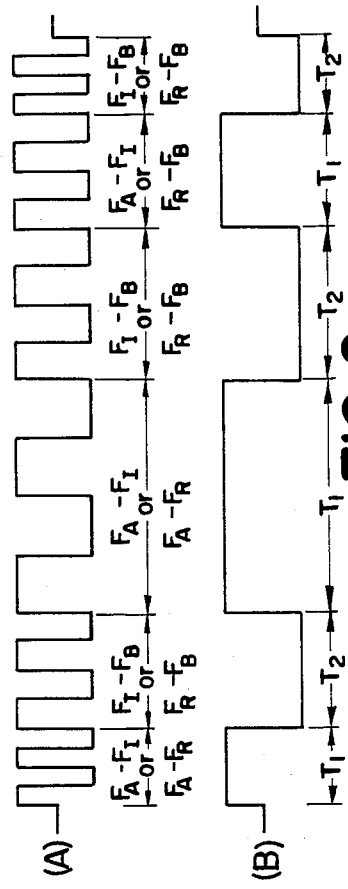
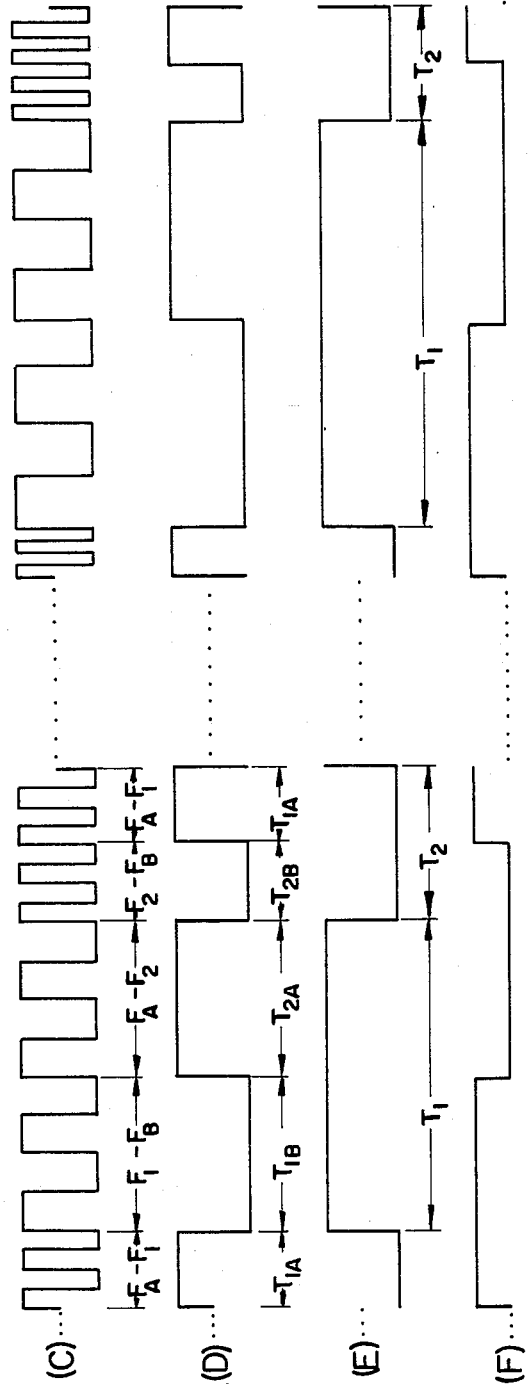

FREQUENCY-TO-VOLTAGE CONVERTER

TECHNICAL FIELD

The present invention relates, in general, to the demodulation of a frequency modulated signal and, in particular, to circuitry for developing an analog output signal representative of the information contained in the varying repetition rate of a digital input signal.

BACKGROUND ART

Frequency modulation and frequency-to-voltage converters which detect the information in a frequency modulated signal are part of an old and well-established art. It is virtually impossible to provide a brief statement of the prior contributions of others to this art because such a wide variety of signal processing techniques have been suggested previously.

Although the frequency modulation art is old and well-established, the circuitry commercialized in the past for detecting the information in frequency modulated signal suffers from certain shortcomings. A major problem is that variations in the values of circuit components, caused for example by environmental changes, component aging and manufacturing tolerances, introduce errors in the accuracy of the output signals. This affects the ability of the frequency detector circuitry to interface effectively with other processing circuitry.

DISCLOSURE OF THE INVENTION

A frequency-to-voltage converter, constructed in accordance with the present invention, includes means for supplying an input signal having a repetition rate which varies within a predetermined range and means for supplying a repetitive reference signal having a fixed repetition rate. Also included are means responsive to the input signal and the reference signal for (a) developing from one of these signals a first framing signal having a repetition rate which is greater than the repetition rate of the other of these signals and a second framing signal having a repetition rate which is less than the repetition rate of the other of these signals, and (b) mixing the other signal with the first framing signal to develop a first difference signal having a repetition rate corresponding to the difference in repetition rates between the other signal and the first framing signal and mixing the other signal with the second framing signal to develop a second difference signal having a repetition rate corresponding to the difference in repetition rates between the other signal and the second framing signal. A prescribed number of pulses of the first difference signal are counted to develop a first count pulse having a duration proportional to the time required to count the prescribed number of pulses of the first difference signal and the same number of pulses of the second difference signal are counted to develop a second count pulse having a duration proportional to the time required to count the prescribed number of pulses of the second difference signal. The development of the framing signals is controlled so that the framing signals are developed in timed alternating sequence.

BRIEF DESCRIPTION OF THE DRAWINGS

Referring to the drawings:

FIG. 2 shows two waveform diagrams useful in understanding the operation of the FIG. 1 circuit;

FIG. 4 shows four waveform diagrams useful in understanding the operation of the FIG. 3 circuit.

BEST MODE FOR CARRYING OUT THE INVENTION

Figure 1:
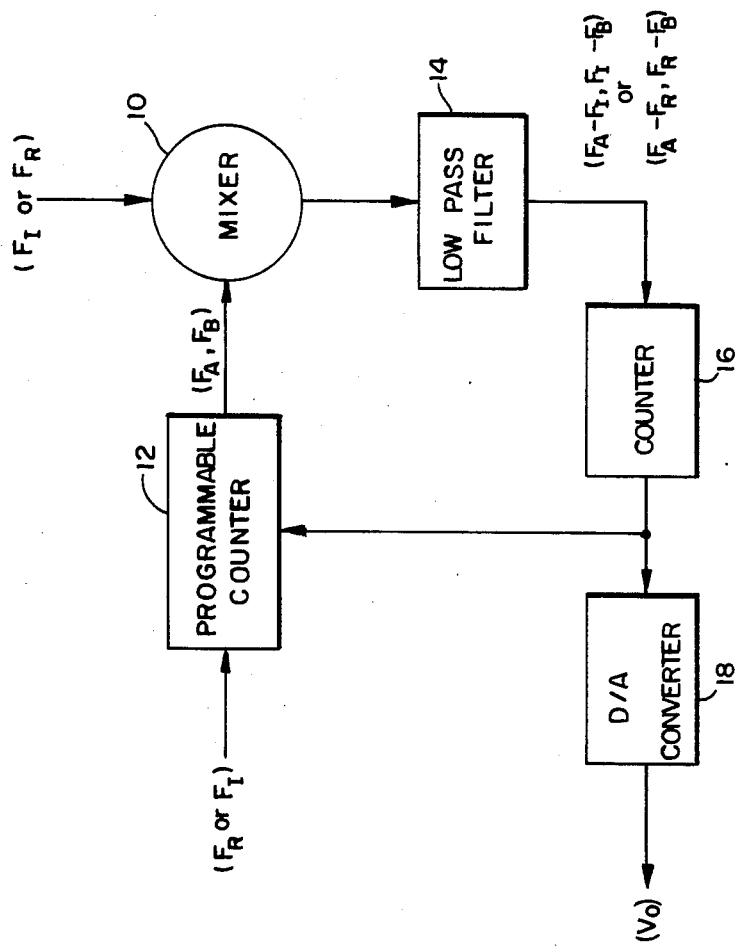
FIG. 1 is a circuit diagram of a preferred embodiment of a frequency-to-voltage converter constructed in accordance with the present invention.

The frequency-to-voltage converter shown in FIG. 1 is arranged to respond either to the repetition rate of an input signal or the period of an input signal. For the former, an input signal, for example, a series of pulses having a repetition rate ($F_I$) which varies within a predetermined range, is supplied to a mixer 10, while a reference signal, for example, a series of pulses having a fixed repetition rate ($F_R$), is supplied to a programmable counter 12. The programmable counter develops, from the reference signal, a first framing signal having a fixed repetition rate ($F_A$) which is greater than the maximum repetition rate of the input signal and a second framing signal having a fixed repetition rate ($F_B$) which is less than the minimum repetition rate of the input signal. The framing signals are developed by first dividing the reference signal by a first number or scaling factor to develop the first framing signal and then dividing the reference signal by a second number or scaling factor to develop the second framing signal. If "M" and "N" are the scaling factors which divide the reference signal to produce the framing signals:

$$F_A = F_R/M$$

and $$F_B = F_R/N$$

The framing signals are supplied to mixer 10 which develops, in the usual way, sum and difference signals, which, in turn, are supplied to a low pass filter 14 which filters out the sum signals. Thus, the output from low pass filter 14 is a first difference signal having a varying repetition rate ($F_A - F_I$) corresponding to the difference in repetition rates between the first framing signal and the input signal and a second difference signal having a varying repetition rate ($F_I - F_B$) corresponding to the difference in repetition rates between the second framing signal and the input signal. Waveform (A) of FIG. 2 is an example of the difference signals produced by mixer 10 and low pass filter 14. During the times the programmable counter 12 develops the first framing signal, the output from low pass filter 14 is the first difference signal, while during the times that the programmable counter develops the second framing signal, the output from the low pass filter is the second difference signal. It will be noticed that the repetition rates of the difference signals are fairly constant within any period during which the difference signals are developed but can change over time as indicated by the different repetition rates of the first difference signals and the different repetition rates of the second difference signals.

The outputs from low pass filter 14 are supplied to a counter 16 which counts a prescribed number of pulses of the first difference signal to develop a first count pulse having a duration ($T_1$) proportional to the time required to count the prescribed number of pulses of the first difference signal and then counts the same number of pulses of the second difference signal to develop a second count pulse having a duration ($T_2$) proportional to the time required to count the prescribed number of pulses of the second difference signal. For the example shown in FIG. 2, four pulses, two positive-going and two negative-going, are counted, and after the prescribed number of pulses have been counted, a new count is started. With the start of each new count, the output of counter 16 changes level to form pulses having durations corresponding to the times required to count the prescribed number of pulses. This is shown in waveform (B) of FIG. 2. The higher level of the counter output represents counting pulses of the first difference signal, while the lower level of the counter output represents counting pulses of the second difference signal. The relative time durations ($T_1$ and $T_2$) of waveform (B) provide an indication of the changes in repetition rate ($F_I$) of the input signal relative to the fixed repetition rate ($F_R$) of the reference signal.

The output of counter 16 also controls the operation of programmable counter 12. Each change in level of the output of counter 16 causes a change in the scaling factor (M or N) which divides the repetition rate of the reference signal. In this way, the first and the second framing signals are developed in timed alternating sequence with the first framing signal and the first difference signal being developed for the duration of the first count pulse produced by counter 16 and the second framing signal and the second difference signal being developed for the duration of the second count pulse produced by counter 16.

The output of counter 16 is supplied to a digital-to-analog converter 18 which develops an indication of the changes in repetition rate ($F_I$) of the input signal relative to the fixed repetition rate ($F_R$) of the reference signal. Digital-to-analog converter 18 functions as an averaging integrator in developing an analog output which varies in accordance with the relative time durations $T_1$ and $T_2$ of the counter output pulses. Specifically, the voltage output ($V_0$) of digital-to-analog converter 18 is expressed as:

$$V_0 = \frac{T_1 - T_2}{T_1 + T_2} \quad (1)$$

Where:

$$T_1 = \frac{1}{F_A - F_I} \text{ and } T_2 = \frac{1}{F_I - F_B}$$

By substituting for $T_1$ and $T_2$ in equation (1) and simplifying:

$$V_0 = \left[\frac{F_I}{F_R} \times \frac{2MN}{N-M}\right] - \left[\frac{N+M}{N-M}\right] \quad (2)$$

If $F_{IO}$ is the repetition rate of the input signal which produces zero voltage output, then when substituting in equation (2):

$$0 = \left[\frac{F_{IO}}{F_R} \times \frac{2MN}{N-M}\right] - \left[\frac{N+M}{N-M}\right] \quad (3)$$

Simplifying equation (3):

$$F_R = \left[\frac{2MN}{N+M}\right]F_{IO} \quad (4)$$

Substituting for $F_R$ in equation (2) and simplifying:

$$V_0 = \left[\frac{N+M}{N-M}\right]\left[\frac{F_I - F_{IO}}{F_{IO}}\right] \quad (5)$$

With M, N, and $F_{IO}$ fixed, equation (5) can be expressed as:

$$V_0 = K_1(F_I - F_{IO}) \quad (6)$$

Where:

$$K_1 = \left[\frac{N+M}{N-M}\right]\frac{1}{F_{IO}}$$

Equation (6) represents a linear function between the repetition rate ($F_I$) of the input signal and the voltage output ($V_0$) of digital-to-analog converter 18.

By way of example, with:
$F_R = 4.333$ MHz
$F_I = 4$ MHz
$M = 1$
$N = 2$
the framing signal frequencies are:
$F_A = 4.333$ MHz
$F_B = 2.166$ MHz
and the difference signal frequencies are:

$(F_A - F_I) = 0.333$ MHz $(F_I - F_B) = 1.833$ MHz

FIG. 1 indicates that the input signal can be supplied to programmable counter 12 instead of to mixer 10 and that the reference signal can be supplied to mixer 10 instead of programmable counter 12. When this is done, the frequency-to-voltage converter shown in FIG. 1 is arranged to respond to the period ($P_I$) of the input signal. In this mode of operation, programmable counter 12 develops a first framing signal having a varying repetition rate ($F_A$) which is greater than the repetition rate ($F_R$) of the reference signal and a second framing signal having a varying repetition rate ($F_B$) which is less than the repetition rate of the reference signal. The repetition rates ($F_A$ and $F_B$) of the framing signals are expressed as:

$$F_A = \frac{1}{P_I M} \text{ and } F_B = \frac{1}{P_I N}$$

By again starting with:

$$V_0 = \frac{T_1 - T_2}{T_1 + T_2} \quad (7)$$

Where:

$$T_1 = \frac{1}{F_A - F_R} \text{ and } T_2 = \frac{1}{F_R - F_B}$$

and substituting for $T_1$ and $T_2$ in equation (7) and simplifying:

$$V_0 = \left[ \frac{P_I}{P_R} \times \frac{2MN}{N-M} \right] - \left[ \frac{N+M}{N-M} \right] \quad (8)$$

Where $P_R$ is the period of the reference signal.

If $P_{IO}$ is the period of the input signal which produces zero output voltage, then when substituting in equation (8) and simplifying:

$$P_R = \left[ \frac{2MN}{N+M} \right] P_{IO} \quad (9)$$

Substituting for $P_R$ in equation (8) and simplifying:
$$V_0 = K_2(P_I - P_{IO}) \quad (10)$$

Where:

$$K_2 = \left[ \frac{N+M}{N-M} \right] \frac{1}{P_{IO}}$$

Equation (10) represents a linear function between the period ($P_I$) of the input signal and the voltage output ($V_0$) of digital-to-analog converter 18.

Digital-to-analog converter 18 is arranged as an averaging differential integrator. Such a circuit is composed of a pair of resistors connected to the opposite sides of a capacitor. The output of counter 16 is supplied to one resistor and an inverted version of the output of the counter is supplied to the other resistor. The voltage at the junction of one resistor and the capacitor is expressed as:

$$V_1 = \frac{T_1}{T_1 + T_2} \quad (11)$$

and the voltage at the junction of the other resistor and the capacitor is expressed as:

$$V_2 = \frac{T_1}{T_1 + T_2} \quad (12)$$

The output voltage of digital-to-analog converter 18 is:

$$V_0 = V_1 - V_2 \quad (13)$$

which, after substitutions from equations (11) and (12), becomes:

$$V_0 = \frac{T_1 - T_2}{T_1 + T_2} \quad (14)$$

Applicant's copending application Ser. No. 925,022, filed Nov. 6, 1986, which is a continuation-in-part of application Ser. No. 800,984, filed Nov. 22, 1985, describes and claims a preferred digital-to-analog converter which can be incorporated in the present invention. The contents of applicant's copending application are incorporated herein by reference.

Figure 3:
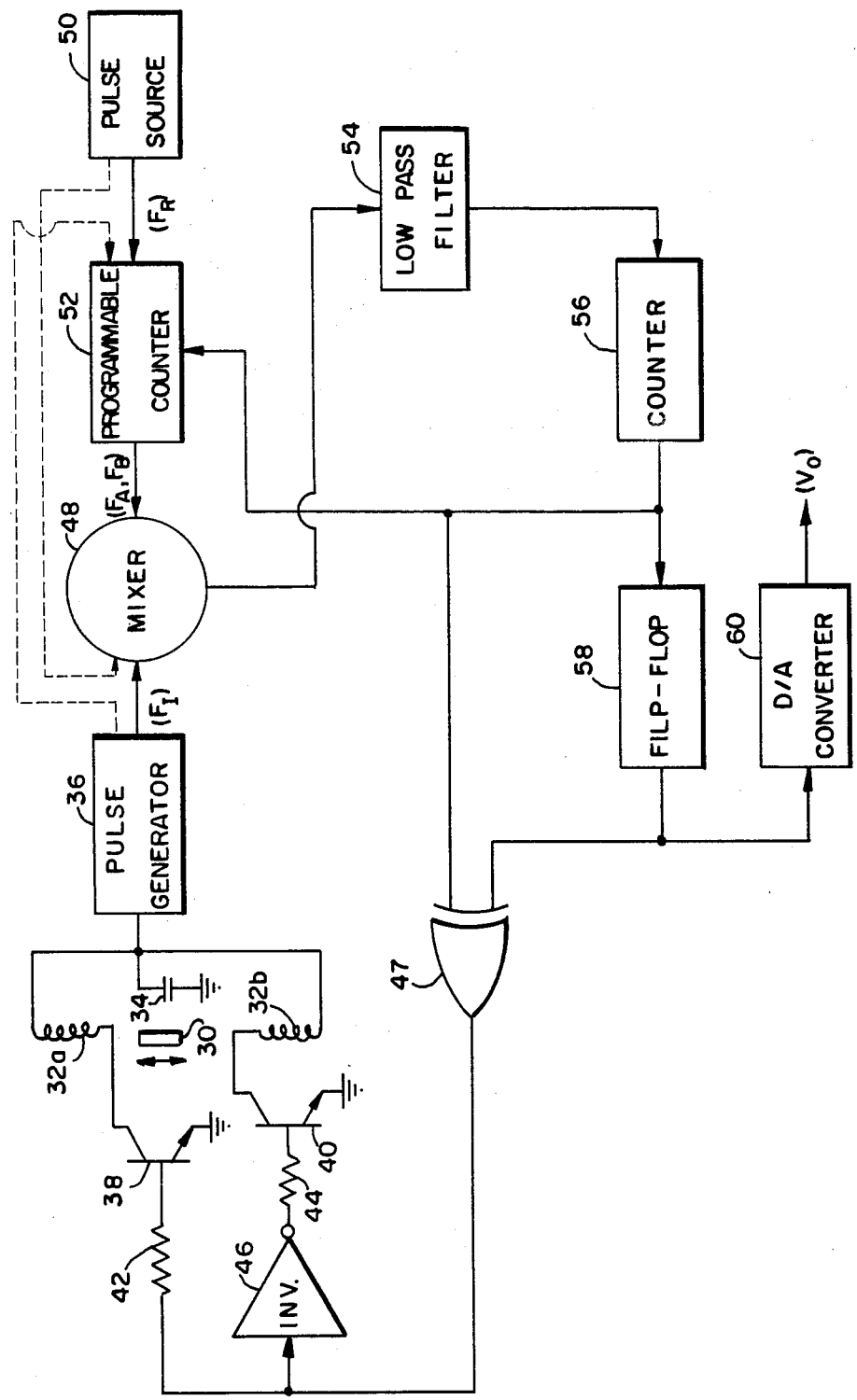
FIG. 3 is a circuit diagram illustrating the application of the present invention to developing an output indication of a non-contacting inductance coil sensor unit.

FIG. 3 is a circuit diagram illustrating the application of the present invention to developing an output indication of a non-contacting inductance coil sensor unit, such as the one described and illustrated in applicant's co-pending application Ser. No. 821,982, filed Jan. 29, 1986, which is a continuation-in-part of application Ser. No. 700,018, filed Feb. 11, 1985. The contents of this co-pending application also are incorporated herein by reference. It will be apparent, however, that the present invention can be used with other sensor units.

Referring to FIG. 3, the sensor apparatus includes a differential sensor having a movable component 30 and first and second sensing means in the form of stationary inductance coils 32a and 32b. Movable component 30 is arranged to move in accordance with a parameter to be monitored. The inductance of each of the two coils is dependent upon the position of movable component 30 relative to each of the coils. The stationary inductance coils and a capacitor 34 form a pair of tank circuits which are connected in timed alternating sequence to a pulse generator 36. In particular, coils 32a and 32b are switched, in timed alternating sequence, to the input of pulse generator 36 by a switching circuit composed of a pair of transistors 38 and 40, a pair of resistors 42 and 44, an inverter 46, and an exclusive OR gate 47.

At any particular time, the tank circuit composed of stationary inductance coil 32a and capacitor 34 or the tank circuit composed of stationary inductance coil 32b and capacitor 34 is connected to pulse generator 36. During those periods when coil 32a is connected to pulse generator 36, the repetition rate at the output of the pulse generator corresponds to the resonance frequency of the tank circuit formed by coil 32a and capacitor 34. During those periods when coil 32b is connected to pulse generator 36, the repetition rate of the output of the pulse generator corresponds to the resonance frequency of the tank circuit formed by coil 32b and capacitor 34. The resonance frequencies of each of the two tank circuits is dependent upon the inductance of each of the two coils. Thus, the output from pulse generator 36 is composed of a first series of pulses having a varying repetition rate representative of the position of movable component 30 relative to inductance coil 32a and a second series of pulses having a varying repetition rate representative of the position of movable component 30 relative to inductance coil 32b. As movable component 30 is moved between inductance coils 32a and 32b, the repetition rates of the first and the second series of pulses produced by pulse generator 36 will change in opposite directions, with the repetition rate of one series of pulses, resulting from movement of the movable component relative to one of the inductance coils, increasing and the repetition rate of the other series of pulses, resulting from movement of the movable component relative to the other inductance coil, decreasing.

The output from pulse generator 36 is supplied as an input signal to a mixer 48 similar to mixer 10 in FIG. 1. The repetition rates of the two series of input pulses are represented in FIG. 3 by ($F_I$).

A reference signal, in the form of a series of pulses having a fixed repetition rate, is supplied by a pulse source 50 to a programmable counter 52, similar to programmable counter 12 in FIG. 1. Programmable counter 52 develops two framing signals for each input series of pulses. Specifically, a first framing signal is developed during the first series of input pulses and has a fixed repetition rate greater than the maximum repetition rate of the first series of input pulses supplied by pulse generator 36. Programmable counter 52 also develops a second framing signal while the first series of input pulses is being supplied which has a fixed repetition rate less than the minimum repetition rate of the first series of input pulses. Programmable counter 52 also develops third and fourth framing signals while the second series of input pulses is being supplied which have fixed repetition rates greater and less, respectively, than the maximum and minimum repetition rates of the second series of input pulses. The framing signals are developed by dividing the reference signal by a first number to develop the first framing signal, dividing the reference signal by a second number to develop the second framing signal, again dividing the reference signal by the first number to develop the third framing signal and again dividing the reference signal by the second number to develop the fourth framing signal.

The reference signal and the framing signals are mixed by mixer 48 to produce, in the usual way, sum and difference signals, which, in turn, are supplied to a low pass filter 54, similar to low pass filter 14 in FIG. 1, which filters out the sum signals. The outputs of low pass filter 14 are four difference signals represented by waveform (C) of FIG. 4. The first difference signal has a varying repetition rate $(F_A-F_1)$ corresponding to the difference in repetition rates between the first series of input pulses and the first framing signal. The second difference signal has a varying repetition rate $(F_1-F_B)$ corresponding to the difference in repetition rates between the first series of input pulses and the second framing signal. The third difference signal has a varying repetition rate $(F_A-F_2)$ corresponding to the difference in repetition rates between between the second series of input pulses and the third framing signal. The fourth difference signal has a varying repetition rate $(F_2-F_B)$ corresponding to the difference in repetition rates between the second series of input pulses and the fourth framing signal. The numeral "1" corresponds to the first series of input pulses produced with inductance coil 32a connected to pulse generator 36, while the numeral "2" corresponds to the second series of input pulses produced with coil 32b connected to the pulse generator. It will be noticed that with the average frequency of the framing signals equal to the average frequency of the differential input frequencies, the repetition rate $(F_1-F_B)$ of the second difference signal is the same as the repetition rate $(F_A-F_2)$ of the third difference signal and that the repetition rate $(F_2-F_B)$ of the fourth difference signal is the same as the repetition rate $(F_A-F_1)$ of the first difference signal. This is illustrated in FIG. 4 and results from appropriate selection of the repetition rate $(F_R)$ of the reference signal relative to the anticipated maximum and minimum repetition rates of the first and the second series of input pulses. For example, with:

$F_R = 4.333$ MHz
$F_1 = 3$ MHz
$F_2 = 3.5$ MHz
$M = 1$
$N = 2$ the framing signal frequencies are:

$F_A = 4.333$ MHz
$F_B = 2.166$ MHz and the difference signal frequencies are:

$(F_1 - F_B) = 0.833$ MHz
$(F_A - F_2) = 0.833$ MHz
$(F_2 - F_B) = 1.333$ MHz
$(F_A - F_1) = 1.333$ MHz

Moreover, the repetition rates of the difference signals again are fairly constant within any period during which the difference signals are developed but can change over time as indicated by the second set of pulses in waveform (C) of FIG. 4.

The difference signals from low pass filter 54 are supplied to a counter 56, similar to counter 16 in FIG. 1, which counts a prescribed number of pulses of each of the difference signals to develop four count pulses having durations proportional to the time required to count the prescribed number of pulses of each difference signal. For the example shown in FIG. 4, four pulses, two positive-going and two negative-going, are counted, for each difference signal and after the prescribed number of pulses have been counted, a new count is started. With the start of each new count, the output of counter 56 changes level to form pulses having durations corresponding to the times required to count the prescribed number of pulses of each difference signal. This is shown in waveform (D) in FIG. 4. The first higher level of the counter output $(T_{1A})$ represents counting pulses of the first difference signal produced while the first series of input pulses is being supplied and the reference signal is being divided by programmable counter 52 by the first number "M". The first lower level of the counter output $(T_{1B})$ represents counting pulses of the second difference signal produced while the first series of input pulses is being supplied and the reference signal is being divided by programmable counter 52 by the second number "N". The second higher level of the counter output $(T_{2A})$ represents counting pulses of the third difference signal produced while the second series of input pulses is being supplied and the reference signal is being divided by programmable counter 52 by the first number "M". The second lower level of the counter output $(T_{2B})$ represents counting pulses of the fourth difference signal produced while the second series of input pulses is being supplied and the reference signal is being divided by programmable counter 52 by the second number "N". With the repetition rates of the second and third difference signals being the same and with the repetition rates of the first and fourth difference signals being the same, the duration $(T_{1B})$ of the second count pulse is the same as the duration $(T_{2A})$ of the third count pulse and the duration $(T_{2B})$ of the fourth count pulse is the same as the duration $(T_{1A})$ of the first count pulse. This indicates that framing factor "M" has the same effect on the development of the difference signal while the first series of input pulses is being supplied as framing factor "N" has on the development of the difference signal while the second series of input pulses is being supplied. Similarly, framing factor "N" has the same effect on the development of the difference signal while the first series of input pulses is being supplied as framing factor "M" has on the development of the difference signal while the second series of input pulses is being supplied.

The count pulses from counter 56 are supplied to a flip-flop 58 which operates in the usual way and changes state at half the rate of the pulses supplied from counter 56. Waveform (E) of FIG. 4 represents the output of flip-flop 58. Time $T_1$ provides an indication of the time required to count the prescribed number of pulses of the second and third difference signals and time $T_2$ provides an indication of the time required to count the prescribed number of pulses of the first and fourth difference signals. The relative time durations $T_1$ and $T_2$ provide an indication of the changes in repetition rate of each of the two series of input pulses relative to the fixed repetition rate of the reference signal. As a result, the relative time durations $T_1$ and $T_2$ provide an indication of the changes in repetition rates of one of the input series of pulses relative to changes in the repetition rate of the other input series of pulses. For the example given, time $T_1$ is equal to twice the time required to count the prescribed number of pulses of either the second difference signal or the third difference signal (both having the same repetition rate) and time $T_2$ is equal to twice the time required to count the prescribed number of pulses of either the first difference signal or the fourth difference signal (both having the same repetition rate).

The output of counter 56 also controls operation of programmable counter 52. Each change in level of the output of counter 56 causes a change in the framing factor which divides the repetition rate of the reference signal. In this way, the first framing signal and the first difference signal are developed for the duration of the first count pulse, the second framing signal and the second difference signal are developed for the duration of the second count pulse, the third framing signal and the third difference signal are developed for the duration of the third count pulse, and the fourth framing signal and the fourth difference signal are developed for the duration of the fourth count pulse.

The output of flip-flop 58 is supplied to a digital-to-analog converter 60, similar to digital-to-analog converter 18 in FIG. 1, which develops an indication of the changes in repetition rate of the two input series of pulses. Again, the digital-to-analog converter functions as an averaging integrator in developing an analog output which varies in accordance with changes in the relative time durations $T_1$ and $T_2$ of the output pulses from flip-flop 58.

The outputs of counter 56 and flip-flop 58 also are supplied to exclusive OR gate 47 which develops an output represented by waveform (F) of FIG. 4. In this way, stationary inductance coils 32a and 32b are switched to the input of pulse generator 36 in timed alternating sequence for equal time periods as indicated by waveform (F).

The dashed lines in FIG. 3 indicate that this embodiment of the invention also can be arranged to respond to the period of the input series of pulses instead of the repetition rate of the input series of pulses. This is accomplished by connecting the output of pulse generator 36 to programmable counter 52 and connecting the output of pulse source 50 to mixer 48. With this arrangement, the four framing signals have varying repetition rates because each is produced by dividing the input signal from pulse generator 36 by the scaling factors.

The foregoing has set forth exemplary and preferred embodiments of the present invention. It will be understood, however, that various alternatives will occur to those of ordinary skill in the art without departure from the spirit or scope of the present invention.

What is claimed:

1. A frequency-to-voltage converter comprising:
   means for supplying an input signal having a repetition rate which varies within a predetermined range;
   means for supplying a repetitive reference signal having a fixed repetition rate;
   developing and mixing means responsive to said input signal and said reference signal for:
   (a) developing from one of said signals a first framing signal having a repetition rate which is greater than the repetition rate of the other of said signals and a second framing signal having a repetition rate which is less than the repetition rate of said other signal, and
   (b) mixing said other signal with said first framing signal to develop a first difference signal composed of a series of pulses having a repetition rate corresponding to the difference in repetition rates between said other signal and said first framing signal and mixing said other signal with said second framing signal to develop a second difference signal composed of a series of pulses having a repetition rate corresponding to the difference in repetition rates between said other signal and said second framing signal;
   means responsive to said first and said second difference signals for counting a prescribed number of pulses of said first difference signal to develop a first count pulse having a duration proportional to the time required to count said prescribed number of pulses of said first difference signal and for counting the same number of pulses of said second difference signal to develop a second count pulse having a duration proportional to the time required to count said prescribed number of pulses of said second difference signal;
   and means for controlling said developing and mixing means to develop said first and said second framing signals in timed alternating sequence.

2. A frequency-to-voltage converter according to claim 1 wherein said developing and mixing means are responsive to said count pulses to develop said first framing signal and said first difference signal for the duration of said first count pulse and said second framing signal and said second difference signal for the duration of said second count pulse.

3. A frequency-to-voltage converter according to claim 2 further including indicating means responsive to said count pulses for developing an output indication of the relative time durations required to count said prescribed number of pulses of said first difference signal and said prescribed number of pulses of said second difference signal.

4. A frequency-to-voltage converter comprising:
   means for supplying an input signal having a repetition rate which varies within a predetermined range;
   means for supplying a repetitive reference signal having a fixed repetition rate;
   developing means responsive to said reference signal for developing a first framing signal having a fixed repetition rate which is greater than the maximum repetition rate of said input signal and a second framing signal having a fixed repetition rate which is less than the minimum repetition rate of said input signal;
   means for mixing said input signal and said first framing signal to develop a first difference signal composed of a series of pulses having a varying repetition rate corresponding to the difference in repetition rates between said first framing signal and said input signal and a second difference signal composed of a series of pulses having a varying repetition rate corresponding to the difference in repetition rates between said second framing signal and said input signal;
   means responsive to said first and said second difference signals for counting a prescribed number of pulses of said first difference signal to develop a first count pulse having a duration proportional to the time required to count said prescribed number of pulses of said first difference signal and for counting the same number of pulses of said second difference signal to develop a second count pulse having a duration proportional to the time required to count said prescribed number of pulses of said second difference signal;

and means for controlling said developing means to develop said first and said second framing signals in timed alternating sequence.

5. A frequency-to-voltage converter according to claim 4 wherein said developing means are responsive to said count pulses to develop said first framing signal and said first difference signal for the duration of said first count pulse and said second framing signal and said second difference signal for the duration of said second count pulse.

6. A frequency-to-voltage converter according to claim 5 further including indicating means responsive to said count pulses for developing an output indication of the relative time durations required to count said prescribed number of pulses of said first difference signal and said prescribed number of pulses of said second difference signal.

7. A frequency-to-voltage converter according to claim 6 wherein said developing means include means for dividing said reference signal by a first number to develop said first framing signal and by a second number to develop said second framing signal.

8. A frequency-to-voltage converter comprising:
means for supplying an input signal having a repetition rate which varies within a predetermined range;
means for supplying a repetitive reference signal having a fixed repetition rate;
developing means responsive to said input signal for developing a first framing signal having a varying repetition rate which is greater than the repetition rate of said reference signal and a second framing signal having a varying repetition rate which is less than the repetition rate of said reference signal;
means for mixing said reference signal and said first framing signal to develop a first difference signal composed of a series of pulses having a varying repetition rate corresponding to the difference in repetition rates between said first framing signal and said reference signal and a second difference signal composed of a series of pulses having a varying repetition rate corresponding to the difference in repetition rates between said second framing signal and said reference signal;
means responsive to said first and said second difference signals for counting a prescribed number of pulses of said first difference signal to develop a first count pulse having a duration proportional to the time required to count said prescribed number of pulses of said first difference signal and for counting the same number of pulses of said second difference signal to develop a second count pulse having a duration proportional to the time required to count said prescribed number of pulses of said second difference signal;
and means for controlling said developing means to develop said first and said second framing signals in timed alternating sequence.

9. A frequency-to-voltage converter according to claim 8 wherein said developing means are responsive to said count pulses to develop said first framing signal and said first difference signal for the duration of said first count pulse and said second framing signal and said second difference signal for the duration of said second count pulse.

10. A frequency-to-voltage converter according to claim 9 further including indicating means responsive to said count pulses for developing an output indication of the relative time durations required to count said prescribed number of pulses of said first difference signal and said prescribed number of pulses of said second difference signal.

11. A frequency-to-voltage converter according to claim 10 wherein said developing means include means for dividing said input signal by a first number to develop said first framing signal and by a second number to develop said second framing signal.

12. A frequency-to-voltage converter for developing an analog output representative of the difference between two digital inputs, said converter comprising:
input signal means for supplying an input signal composed of a first series of input pulses having a varying repetition rate representative of a first digital input and a second series of input pulses having a varying repetition rate representative of a second digital input;
means for supplying a repetitive reference signal having a fixed repetition rate;
developing means responsive to said input signal and said reference signal for:
(a) developing from one of said signals:
(1) a first framing signal while said first series of input pulses is being supplied which has a repetition rate greater than the repetition rate of the other of said signals,
(2) a second framing signal while said first series of input pulses is being supplied which has a repetition rate less than the repetition rate of said other signal,
(3) a third framing signal while said second series of input pulses is being supplied which has a repetition rate greater than the repetition rate of said other signal, and
(4) a fourth framing signal while said second series of input pulses is being supplied which has a repetition rate less than the repetition rate of said other signal, and
(b) mixing said other signal with:
(1) said first framing signal to develop a first difference signal composed of a series of pulses having a repetition rate corresponding to the difference in repetition rates between said other signal and said first framing signal,
(2) said second framing signal to develop a second difference signal composed of a series of pulses having a repetition rate corresponding to the difference in repetition rates between said other signal and said second framing signal,
(3) said third framing signal to develop a third difference signal composed of a series of pulses having a repetition rate corresponding to the difference in repetition rates between said other signal and said third framing signal, and
(4) said fourth framing signal to develop a fourth difference signal having a repetition rate corresponding to the difference in repetition rates between said other signal and said fourth framing signal;
means responsive to said difference signals for:

(a) counting a prescribed number of pulses of said first difference signal to develop a first count pulse having a duration proportional to the time required to count said prescribed number of pulses of said first difference signal, (b) counting the same number of pulses of said second difference signal to develop a second count pulse having a duration proportional to the time required to count said prescribed number of pulses of said second difference signal, (c) counting the same number of pulses of said third difference signal to develop a third count pulse having a duration proportional to the time required to count said prescribed number of pulses of said third difference signal, and (d) counting the same number of pulses of said fourth difference signal to develop a fourth count pulse having a duration proportional to the time required to count said prescribed number of pulses of said fourth difference signal;

means for controlling said developing and mixing means to develop said first and said second framing signals while said first series of input pulses is being supplied and to develop said third and said fourth framing signals while said second series of input pulses is being supplied;

and indicating means responsive to said count pulses for developing an output indication of relative time durations required to count:

(a) said prescribed number of pulses of said second and said third difference signals, and (b) said prescribed number of pulses of said fourth and said first difference signals.

13. A frequency-to-voltage converter according to claim 12 wherein said developing and mixing means are responsive to said count pulses to develop:

(a) said first framing signal and said first difference signal for the duration of said first count pulse, (b) said second framing signal and said second difference signal for the duration of said second count pulse, (c) said third framing signal and said third difference signal for the duration of said third count pulse, and (d) said fourth framing signal and said fourth difference signal for the duration of said fourth count pulse.

14. A frequency-to-voltage converter according to claim 13 wherein said indicating means include:

(a) means for developing a first indication of the time required to count said prescribed number of pulses of said second and said third difference signals and a second indication of the time required to count said prescribed number of pulses of said fourth and said first difference signals, and (b) means responsive to said first and said second indications for developing said output indication.

15. A frequency-to-voltage converter for developing an analog output representative of the difference between two digital inputs, said converter comprising:

input signal means for supplying an input signal composed of a first series of input pulses having a varying repetition rate representative of a first digital input and a second series of input pulses having a varying repetition rate representative of a second digital input;

means for supplying a repetitive reference signal having a fixed repetition rate;

developing means responsive to said input signal for developing:

(a) a first framing signal while said first series of input pulses is being supplied which has a varying repetition rate greater than the repetition rate of said reference signal, (b) a second framing signal while said first series of input pulses is being supplied which has a varying repetition rate less than the repetition rate of said reference signal, (c) a third framing signal while said second series of input pulses is being supplied which has a varying repetition rate greater than the repetition rate of said reference signal, and (d) a fourth framing signal while said second series of input pulses is being supplied which has a varying repetition rate less than the repetition rate of said reference signal;

means for mixing said reference signal with:

(a) said first framing signal to develop a first difference signal composed of a series of pulses having a varying repetition rate corresponding to the difference in repetition rates between said reference signal and said first framing signal, (b) said second framing signal to develop a second difference signal composed of a series of pulses having a varying repetition rate corresponding to the difference in repetition rates between said reference signal and said second framing signal, (c) said third framing signal to develop a third difference signal composed of a series of pulses having a varying repetition rate corresponding to the difference in repetition rates between said reference signal and said third framing signal, and (d) said fourth framing signal to develop a fourth difference signal composed of a series of pulses having a varying repetition rate corresponding to the difference in repetition rates between said reference signal and said fourth framing signal;

means responsive to said difference signals for:

(a) counting a prescribed number of pulses of said first difference signal to develop a first count pulse having a duration proportional to the time required to count said prescribed number of pulses of said first difference signal, (b) counting the same number of pulses of said second difference signal to develop a second count pulse having a duration proportional to the time required to count said prescribed number of pulses of said second difference signal, (c) counting the same number of pulses of said third difference signal to develop a third count pulse having a duration proportional to the time required to count said prescribed number of pulses of said third difference signal, and (d) counting the same number of pulses of said fourth difference signal to develop a fourth count pulse having a durtion proportional to the time required to count said prescribed number of pulses of said fourth difference signal;

means for controlling said developing means to develop said first and said second framing signals while said first series of input pulses is being supplied and to develop said third and said fourth framing signals while said second series of input pulses is being supplied;

and indicating means responsive to said count pulses for developing an output indication of the relative time durations required to count:
  (a) said prescribed number of pulses of said second and said third difference signals, and
  (b) said prescribed number of pulses of said fourth and said first difference signals.

16. A frequency-to-voltage converter according to claim 15 wherein said developing means are responsive to said count pulses to develop:
  (a) said first framing signal and said first difference signal for the duration of said first count pulse,
  (b) said second framing signal and said second difference signal for the duration of said second count pulse,
  (c) said third framing signal and said third difference signal for the duration of said third count pulse, and
  (d) said fourth framing signal and said fourth difference signal for the duration of said fourth count pulse.

17. A frequency-to-voltage converter according to claim 16 wherein said indicating means include:
  (a) means for developing a first indication of the time required to count said prescribed number of pulses of said second and said third difference signals and a second indication of the time required to count said prescribed number of pulses of said fourth and said first difference signals, and
  (b) means responsive to said first and said second indications for developing said output indication.

18. A frequency-to-voltage converter according to claim 17 wherein said developing means include means for dividing:
  (a) said first series of input pulses by a first number to develop said first framing signal,
  (b) said first series of input pulses by a second number to develop said second framing signal,
  (c) said second series of input pulses by said first number to develop said third framing signal, and
  (d) said second series of input pulses by said second number to develop said fourth framing signal.

19. Sensor apparatus comprising:
a pulse generator;
a differential sensor having a movable component and first and second sensing means for controlling said pulse generator to supply an input signal composed of first and second series of input pulses having repetition rates which change in opposite directions in response to movement of said movable component relative to said first and said second sensing means, said first series of pulses having a varying repetition rate representative of the position of said movable component relative to said first sensing means and said second series of pulses having a varying repetition rate representative of the postiion of said movable component relative to said second sensing means;
means for moving said movable component in accordance with a parameter being monitored;
means for supplying a repetitive reference signal having a fixed repetition rate;
developing and mixing means responsive to said input signal and said reference signal for:
  (a) developing from one of said signals:
    (1) a first framing signal while said first series of input pulses is being supplied which has a repetition rate greater than the repetition rate of the other of said signals,
    (2) a second framing signal while said first series of input pulses is being supplied which has a repetition rate less than the repetition rate of said other signal,
    (3) a third framing signal while said second series of input pulses is being supplied which has a repetition rate greater than the repetition rate of said other signal, and
    (4) a fourth framing signal while said second series of input pulses is being supplied which has a repetition rate less than the repetition rate of said other signal, and
  (b) mixing said other signal with:
    (1) said first framing signal to develop a first difference signal composed of a series of pulses having a repetition rate corresponding to the difference in repetition rates between said other signal and said first framing signal,
    (2) said second framing signal to develop a second difference signal composed of a series of pulses having a repetition rate corresponding to the difference in repetition rates between said other signal and said second framing signal,
    (3) said third framing signal to develop a third difference signal composed of a series of pulses having a repetition rate corresponding to the difference in repetition rates between said other signal and said third framing signal, and
    (4) said fourth framing signal to develop a fourth difference signal composed of a series of pulses having a repetition rate corresponding to the difference in repetition rates between said other signal and said fourth framing signal;
means responsive to said difference signals for:
  (a) counting a prescribed number of pulses of said first difference signal to develop a first count pulse having a duration proportional to the time required to count said prescribed number of pulses of said first difference signal,
  (b) counting the same number of pulses of said second difference signal to develop a second count pulse having a duration proportional to the time required to count said prescribed number of pulses of said second difference signal,
  (c) counting the same number of pulses of said third difference signal to develop a third count pulse having a duration proportional to the time required to count said prescribed number of pulses of said third difference signal, and
  (d) counting the same number of pulses of said fourth difference signal to develop a fourth count pulse having a duration proportional to the time required to count said prescribed number of pulses of said fourth difference signal;
means for connecting said first and said second sensing means to said pulse generator in timed alternating sequence and for controlling said developing and mixing means to develop said first and said second framing signals while said first series of input pulses is being supplied and to develop said third and said fourth framing signals while said second series of input pulses is being supplied;
and indicating means responsive to said count pulses for developing an output indication of relative time durations required to count:
  (a) said prescribed number of pulses of said second and said third difference signals, and (b) said prescribed number of pulses of said fourth and said first difference signals.

20. Sensor apparatus according to claim 19 wherein said developing and mixing means are responsive to said count pulses to develop:
  (a) said first framing signal and said first difference signal for the duration of said first count pulse,
  (b) said second framing signal and said second difference signal for the duration of said second count pulse,
  (c) said third framing signal and said third difference signal for the duration of said third count pulse, and
  (d) said fourth framing signal and said fourth difference signal for the duration of said fourth count pulse.

21. Sensor apparatus according to claim 20 wherein said indicating means include:
  (a) means for developing a first indication of the time required to count said prescribed number of pulses of said second and said third difference signals and a second indication of the time required to count said prescribed number of pulses of said fourth and said first difference signals, and
  (b) means responsive to said first and said second indications for developing said output indication.

22. Sensor apparatus comprising:
a pulse generator;
a differential sensor having a movable component and first and second sensing means for controlling said pulse generator to supply an input signal composed of first and second series of input pulses having repetition rates which change in opposite directions in response to movement of said movable component relative to said first and said second sensing means, said first series of pulses having a varying repetition rate representative of the position of said movable component relative to said first sensing means and said second series of pulses having a varying repetition rate representative of the position of said movable component relative to said second sensing means;
means for moving said movable component in accordance with a parameter being monitored;
means for supplying a repetitive reference signal having a fixed repetition rate;
means responsive to said input signal for developing:
  (a) a first framing signal while said first series of input pulses is being supplied which has a varying repetition rate greater than the repetition rate of said reference signal,
  (b) a second framing signal while said first series of input pulses is being supplied which has a varying repetition rate less than the repetition rate of said reference signal,
  (c) a third framing signal while said second series of input pulses is being supplied which has a varying repetition rate greater than the repetition rate of said reference signal, and
  (d) a fourth framing signal while said second series of input pulses is being supplied which has a varying repetition rate less than the repetition rate of said reference signal;
means for mixing said reference signal with:
  (a) said first framing signal to develop a first difference signal composed of a series of pulses having a varying repetition rate corresponding to the difference in repetition rates between said reference signal and said first framing signal,
  (b) said second framing signal to develop a second difference signal composed of a series of pulses having a varying repetition rate corresponding to the difference in repetition rates between said reference signal and said second framing signal,
  (c) said third framing signal to develop a third difference signal composed of a series of pulses having a varying repetition rate corresponding to the difference in repetition rates between said reference signal and said third framing signal, and
  (d) said fourth framing signal to develop a fourth difference signal composed of a series of pulses having a varying repetition rate corresponding to the difference in repetition rates between said reference signal and said fourth framing signal;
means responsive to said difference signals for:
  (a) counting a prescribed number of pulses of said first difference signal to develop a first count pulse having a duration proportional to the time required to count said prescribed number of pulses of said first difference signal,
  (b) counting the same number of pulses of said second difference signal to develop a second count pulse having a duration proportional to the time required to count said prescribed number of pulses of said second difference signal,
  (c) counting the same number of pulses of said third difference signal to develop a third count pulse having a duration proportional to the time required to count said prescribed number of pulses of said third difference signal, and
  (d) counting the same number of pulses of said fourth difference signal to develop a fourth count pulse having a duration proportional to the time required to count said prescribed number of pulses of said fourth difference signal;
means for connecting said first and said second sensing means to said pulse generator in timed alternating sequence and for controlling said developing means to develop said first and said second framing signals while said first series of input pulses is being supplied and to develop said third and said fourth framing signals while said second series of input pulses is being supplied;
and indicating means responsive to said count pulses for developing an output indication of the relative time durations required to count:
  (a) said prescribed number of pulses of said second and said third difference signals, and
  (b) said prescribed number of pulses of said fourth and said first difference signals.

23. Sensor apparatus according to claim 22 wherein said developing means are responsive to said count pulses to develop:
  (a) said first framing signal and said first difference signal for the duration of said first count pulse,
  (b) said second framing signal and said second difference signal for the duration of said second count pulse,
  (c) said third framing signal and said third difference signal for the duration of said third count pulse, and
  (d) said fourth framing signal and said fourth difference signal for the duration of said fourth count pulse.

24. Sensor apparatus according to claim 23 wherein said indicating means include:

(a) means for developing a first indication of the time required to count said prescribed number of pulses of said second and said third difference signals and a second indication of the time required to count said prescribed number of pulses of said fourth and said first difference signals, and (b) means responsive to said first and said second indications for developing said output indication.

25. Sensor apparatus according to claim 24 wherein said developing means include means for dividing:

(a) said first series of input pulses by a first number to develop said first framing signal, (b) said first series of input pulses by a second number to develop said second framing signal, (c) said second series of input pulses by said first number to develop said third framing signal, and (d) said second series of input pulses by said second number to develop said fourth framing signal.

26. Sensor apparatus according to claim 25 wherein said first and said second sensing means each include a reactance element which responds to movements of said movable component to develop said oppositely directed changes in the repetition rate of said pulse generator.

27. Sensor apparatus according to claim 26 wherein said reactance elements are inductance coils.

28. A frequency-to-voltage converter for developing an analog output representative of the difference between two digital inputs, said converter comprising:

input signal means for supplying an input signal composed of a first series of input pulses having a varying repetition rate representative of a first digital input and a second series of input pulses having a varying repetition rate representative of a second digital input;

means for supplying a repetitive reference signal having a fixed repetition rate;

developing means responsive to said reference signal for developing:

(a) a first framing signal while said first series of input pulses is being supplied which has a fixed repetition rate greater than the maximum repetition rate of said first series of input pulses, (b) a second framing signal while said first series of input pulses is being supplied which has a fixed repetition rate less than the minimum repetition rate of said first series of input pulses, (c) a third framing signal while said second series of input pulses is being supplied which has a fixed repetition rate greater than the maximum repetition rate of said second series of input pulses, and (d) a fourth framing signal while said second series of input pulses is being supplied which has a fixed repetition rate less than the minimum repetition rate of said second series of input pulses;

means for mixing said input signal with:

(a) said first framing signal to develop a first difference signal composed of a series of pulses having a varying repetition rate corresponding to the difference in repetition rates between said first series of input pulses and said first framing signal, (b) said second framing signal to develop a second difference signal composed of a series of pulses having a varying repetition rate corresponding to the difference in repetition rates between said first series of input pulses and said second framing signal, (c) said third framing signal to develop a third difference signal composed of a series of pulses having a varying repetition rate corresponding to the difference in repetition rates between said second series of input pulses and said third framing signal, and (d) said fourth framing signal to develop a fourth difference signal composed of a series of pulses having a varying repetition rate corresponding to the difference in repetition rates between said second series of input pulses and said fourth framing signal;

means responsive to said difference signals for:

(a) counting a prescribed number of pulses of said first difference signal to develop a first count pulse having a duration proportional to the time required to count said prescribed number of pulses of said first difference signal, (b) counting the same number of pulses of said second difference signal to develop a second count pulse having a duration proportional to the time required to count said prescribed number of pulses of said second difference signal, (c) counting the same number of pulses of said third difference signal to develop a third count pulse having a duration proportional to the time required to count said prescribed number of pulses of said third difference signal, and (d) counting the same number of pulses of said fourth difference signal to develop a fourth count pulse having a durtion proportional to the time required to count said prescribed number of pulses of said fourth difference signal;

means for controlling said developing means to develop said first and said second framing signals while said first series of input pulses is being supplied and to develop said third and said fourth framing signals while said second series of input pulses is being supplied;

and indicating means responsive to said count pulses for developing an output indication of the relative time durations required to count:

(a) said prescribed number of pulses of said second and said third difference signals, and (b) said prescribed number of pulses of said fourth and said first difference signals.

29. A frequency-to-voltage converter according to claim 28 wherein said developing means are responsive to said count pulses to develop:

(a) said first framing signal and said first difference signal for the duration of said first count pulse, (b) said second framing signal and said second difference signal for the duration of said second count pulse, (c) said third framing signal and said third difference signal for the duration of said third count pulse, and (d) said fourth framing signal and said fourth difference signal for the duration of said fourth count pulse.

30. A frequency-to-voltage converter according to claim 29 wherein said indicating means include:

(a) means for developing a first indication of the time required to count said prescribed number of pulses of said second and said third difference signals and a second indication of the time required to count said prescribed number of pulses of said fourth and said first difference signals, and (b) means responsive to said first and said second indications for developing said output indication.

31. A frequency-to-voltage converter according to claim 30 wherein said developing means include means for dividing:
   (a) said reference signal by a first number to develop said first and said third framing signals, and
   (b) said reference signal by a second number to develop said second and said fourth framing signals.

32. Sensor apparatus comprising:
   a pulse generator;
   a differential sensor having a movable component and first and second sensing means for controlling said pulse generator to supply an input signal composed of first and second series of input pulses having repetition rates which change in opposite directions in response to movement of said movable component relative to said first and said second sensing means, said first series of pulses having a varying repetition rate representative of the position of said movable component relative to said first sensing means and said second series of pulses having a varying repetition rate representative of the position of said movable component relative to said second sensing means;
   means for moving said movable component in accordance with a parameter being monitored;
   means for supplying a repetitive reference signal having a fixed repetition rate;
   developing means to said reference signal for developing:
   (a) a first framing signal while said first series of input pulses is being supplied which has a fixed repetition rate greater than the maximum repetition rate of said first series of input pulses,
   (b) a second framing signal while said first series of input pulses is being supplied which has a fixed repetition rate less than the minimum repetition rate of said first series of input pulses,
   (c) a third framing signal while said second series of input pulses is being supplied which has a fixed repetition rate greater than the maximum repetition rate of said second series of input pulses, and
   (d) a fourth framing signal while said second series of input pulses is being supplied which has a fixed repetition rate less than the minimum repetition rate of said second series of input pulses;
   means for mixing said input signal with:
   (a) said first framing signal to develop a first difference signal composed of a series of pulses having a varying repetition rate corresponding to the difference in repetition rates between said first series of input pulses and said first framing signal,
   (b) said second framing signal to develop a second difference signal composed of a series of pulses having a varying repetition rate corresponding to the difference in repetition rates between said first series of input pulses and said second framing signal,
   (c) said third framing signal to develop a third difference signal composed of a series of pulses having a varying repetition rate corresponding to the difference in repetition rates between said second series of input pulses and said third framing signal, and
   (d) said fourth framing signal to develop a fourth difference signal composed of a series of pulses having a varying repetition rate, corresponding to the difference in repetition rates between said second series of input pulses and said fourth framing signal;
   means responsive to said difference signals for:
   (a) counting a prescribed number of pulses of said first difference signal to develop a first count pulse having a duration proportional to the time required to count said prescribed number of pulses of said first difference signal,
   (b) counting the same number of pulses of said second difference signal to develop a second count pulse having a duration proportional to the time required to count said prescribed number of pulses of said second difference signal,
   (c) counting the same number of pulses of said third difference signal to develop a third count pulse having a duration proportional to the time required to count said prescribed number of pulses of said third difference signal, and
   (d) counting the same number of pulses of said fourth difference signal to develop a fourth count pulse having a duration proportional to the time required to count said prescribed number of pulses of said fourth difference signal;
   means for connecting said first and said second sensing means to said pulse generator in timed alternating sequence and for controlling said developing means to develop said first and said second framing signals while said first series of input pulses is being supplied and to develop said third and said fourth framing signals while said second series of input pulses is being supplied;
   and indicating means responsive to said count pulses for developing an output indication of the relative time durations required to count:
   (a) said prescribed number of pulses of said second and said third difference signals, and
   (b) said prescribed number of pulses of said fourth and said first difference signals.

33. Sensor apparatus according to claim 32 wherein said developing means are responsive to said count pulses to develop:
   (a) said first framing signal and said first difference signal for the duration of said first count pulse,
   (b) said second framing signal and said second difference signal for the duration of said second count pulse,
   (c) said third framing signal and said third difference signal for the duration of said third count pulse, and
   (d) said fourth framing signal and said fourth difference signal for the duration of said fourth count pulse.

34. Sensor apparatus according to claim 33 wherein said indicating means include:
   (a) means for developing a first indication of the time required to count said prescribed number of pulses of said second and said third difference signals and a second indication of the time required to count said prescribed number of pulses of said fourth and said first difference signals, and
   (b) means responsive to said first and said second indications for developing said output indication.

35. Sensor apparatus according to claim 34 wherein said developing means include means for dividing:
   (a) said reference signal by a first number to develop said first and said third framing signals, and
   (b) said reference signal by a second number to develop said second and said fourth framing signals.

36. Sensor apparatus according to claim 35 wherein said first and said second sensing means each include a reactance element which responds to movements of said movable component to develop said oppositely directed changes in the repetition rate of said pulse generator.

37. Sensor apparatus according to claim 36 wherein said reactance elements are inductance coils.

* * * * *